United States Patent [19]

Losee et al.

[11] 4,179,528

[45] Dec. 18, 1979

[54] METHOD OF MAKING SILICON DEVICE WITH UNIFORMLY THICK POLYSILICON

[75] Inventors: David L. Losee, Fairport; Alvin D. Wilder, Rochester, both of N.Y.

[73] Assignee: Eastman Kodak Company, Rochester, N.Y.

[21] Appl. No.: 797,971

[22] Filed: May 18, 1977

[51] Int. Cl.² .................. H01L 21/363; H01L 21/38
[52] U.S. Cl. ........................................ 427/9; 148/1.5; 148/174; 427/38; 427/85; 427/82; 427/86; 427/93; 427/108; 427/255; 427/372 A
[58] Field of Search .................... 148/174; 427/82, 85, 427/86, 93, 255, 372 A, 9, 10, 38, 108; 156/603, 610

[56] References Cited

U.S. PATENT DOCUMENTS

| | | |
|---|---|---|
| 3,765,940 | 10/1973 | Hentzschel ............................. 427/85 |
| 4,016,016 | 4/1977 | Ipri ....................................... 148/174 |
| 4,068,020 | 1/1978 | Reuschel ................................ 427/82 |

OTHER PUBLICATIONS

Hale, "Preparation and Evaluation of Epitaxial Silicon Films Prepared by Vacuum Evaporation", *Vacuum*, vol. 13, No. 3, Mar. 1963, pp. 93-100.

Lawson et al., "The Optimum Conditions for the Vacuum Deposition of Silicon on Sapphire", J. Phys. D. App. Phys., vol. 11 (11-1970).

*Primary Examiner*—John D. Smith
*Attorney, Agent, or Firm*—Robert F. Cody

[57] ABSTRACT

Thickness control problems inherent in the chemical vapor deposition of polysilicon layers on silicon wafers are avoided by an improved vacuum deposition technique.

7 Claims, 4 Drawing Figures

METHOD OF MAKING SILICON DEVICE WITH UNIFORMLY THICK POLYSILICON

BACKGROUND OF THE INVENTION

1. Field of the Invention

This invention relates in general to semiconductor devices and manufacturing methods thereof, and in particular to silicon semiconductor devices, and manufacturing methods thereof, in which such devices are provided with extremely flat, and thin, polysilicon overcoats.

2. Description Relative to the Prior Art

A typical solid state imaging device comprises a suitably doped wafer (chip), a silicon dioxide coating on the wafer, and transparent electrodes overlaying the silicon dioxide coating. It frequently happens that the transparent electrodes are formed of doped polycrystalline silicon (polysilicon) which is intrinsically compatible with silicon device manufacture.

Prior procedures for forming polysilicon electrodes have usually taken the tack shown in FIG. 1. As indicated, a silicon wafer having a coating of silicon dioxide thereon is exposed to reactant gases (at an elevated temperature) which blow past the wafer and, in so doing, cause a polysilicon coating to form on the silicon dioxide coating. (Shaping and otherwise forming electrode patterns, say by polysilicon etching, form no part of the invention, and are well known techniques in the art.)

Though exaggerated, FIG. 1 shows that the gaseous upstream side of the silicon wafer gets more thickly coated with polysilicon than does the downstream side, causing the polysilicon coating to taper in thickness. Such tapering has certain disadvantages: (1) since imaging devices are, inherently, optical devices, tapering causes "variable" fringing effects to occur across the face of the device; (2) variable sensitivity,, both monochromatic and spectral, across the plane of the device, i.e., from pixel to pixel. Also, even ignoring the tapering effects, chemical vapor deposition, as appears in FIG. 1, is not a tightly controllable practice, and results in batch-to-batch polysilicon thickness variations.

To obviate the tapering effect, and to produce consistently polysilicon layers that are both extremely, and uniformly, thin, say on the order of 1000 Å±20 Å, vacuum deposition of polysilicon was tried. Vacuum deposition of a coating, as is well known, is a generally well controlled procedure, and productive of coatings within close thickness tolerances: Source material (the evaporant) to be vacuum deposited is heated in a vacuum chamber, causing a vapor of the evaporant to deposit on the substrate being coated; a monitor extremely accurately registers the amount of deposition and, when the desired coating thickness has been noted, a shutter or the like is actuated to shield the structure being coated from the vapor.

PROBLEM (See FIG. 2)

In implementing the vacuum deposition of polysilicon on a silicon semiconductor chip, "polysilicon" was —as had appeared to be obvious—employed as the evaporant. Examination of the polysilicon coating so made, however, revealed that relatively huge (as compared to the coating thickness) globs of polysilicon had formed across the surface of the chip, thereby rendering the coated chip useless.

SUMMARY OF THE INVENTION

(Problem Solution)

The invention provides that a polycrystalline silicon coating be formed on a silicon chip by vacuum depositing—not from a source of "polycrystalline silicon"—but rather from a source of "monocrystalline silicon". This has tried and resulted in a uniformly thin (within ±20Å) amorphous coat, such coat being thereafter doped and heated to render it conductive and polycrystalline.

THEORY: An explanation of why monocrystalline silicon, and not polycrystalline silicon, can be vacuum-deposited to form quality polysilicon coatings will be provided later in connection with FIG. 3.

Figure 1:
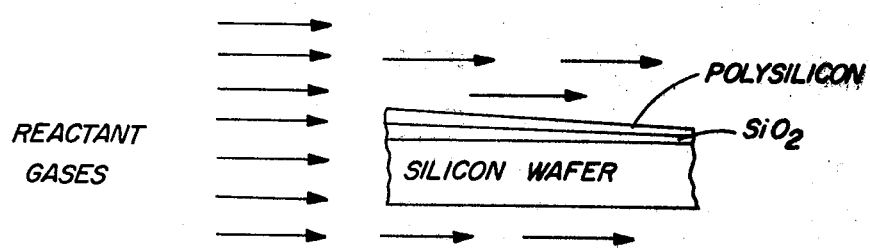
FIG. 1 is a schematic diagram of a prior art practice over which the invention provides improvement.
Figure 2:
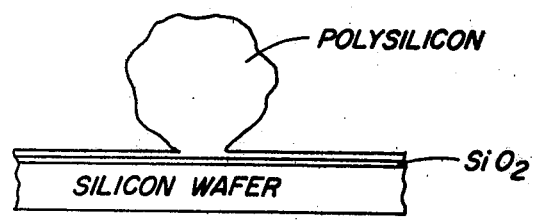
FIG. 2 identifies a problem overcome by means of the invention.
Figure 3:
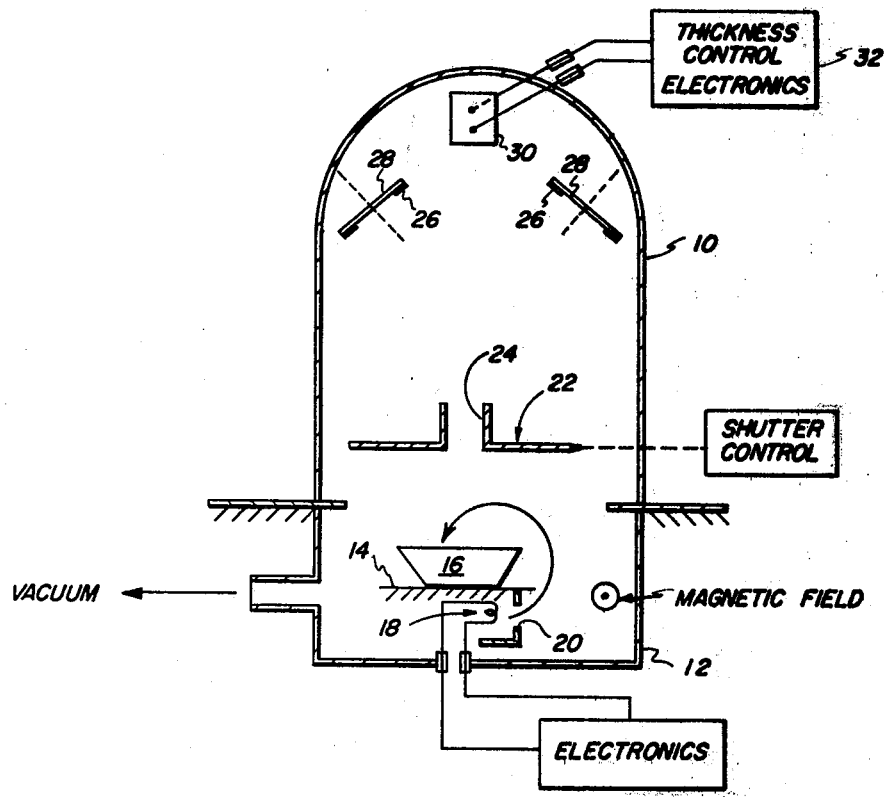
FIG. 3 is a schematic diagram of a vacuum deposition system used in the practice of the invention.

The prior art having been described in connection with FIGS. 1 and 2, reference should be made to FIG. 3:

A vacuum chamber 10 cooperates with an evaporation unit 12, the evaporation unit being connected to a vacuum source capable of providing a chamber vacuum of, say, $5 \times 10^{-6}$ torr. A pedestal 14 within the evaporating unit 12 supports a crucible 16; and an electron source 18 spews high energy electrons through a window 20. Electrons emitted by the source 18 are magnetically directed to the interior of the crucible 16, causing the contents therein to boil.

A shutter 22, having a chute 24 therein, may be actuated to shut off, or not, source vapor from reaching silicon wafers 26 to be coated. The wafers 26 are mounted to wheels 28 which rotate (by means not shown) to assure even coatings on the wafers 26.

A quartz crystal 30 aligns with the chute 24 and, as the crystal 30 gets coated with the evaporant, its resonant frequency changes, signalling a measure of coating thickness to "resettable" electronics 32.

In first attempting to vacuum deposit polysilicon on silicon wafers 26, several chunks of polysilicon were placed in the crucible 16 and electron-beam heated. After the monitor 30, 32 registered the desired coating thickness, the shutter 22 was actuated to shield the wafers 26 from additional coating. Then the wafers were examined, revealing the defects noted in FIG. 2. In seeking an explanation for the FIG. 2 defects, it was postulated that polysilicon, as a result of its formation, perhaps includes tiny gas bubbles trapped within its structure . . . and that such gas bubbles erupted at the surface of the boiling polysilicon and effectively splattered polysilicon in the direction of the coated surfaces of the silicon wafers 26. Corollarily, it was reasoned that monocrystalline silicon—by virtue of the squeegeeing influence of silicon atoms which align to form a monocrystalline silicon structure—would probably include few, if any, trapped gas bubbles. Thus several chunks of monocrystalline silicon were placed in the crucible 16 and used as the evaporant.

After the monitor 30, 32 registered the desired coating thickness, the shutter 22 was actuated to shut off the vacuum deposition. The coating was then examined and revealed an extremely thin coating which was everywhere within ±20Å of the target thickness.

Figure 4:
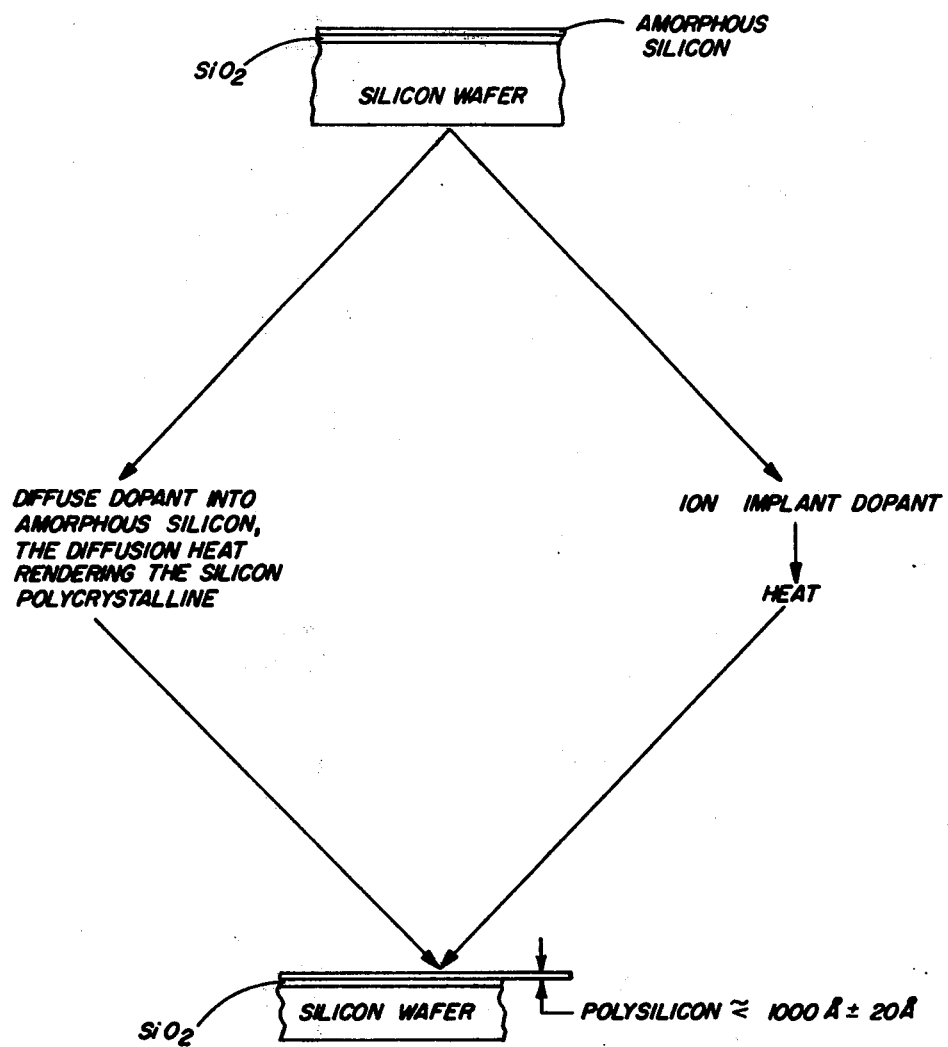
FIG. 4 is a flow diagram identifying post deposition procedures for practicing the invention.

The silicon coating formed by vacuum deposition—whether of poly- or monocrystalline silicon is an amorphous one. In furtherance of the invention (see FIG. 4) the amorphous silicon is converted to polycrystalline silicon by either of two general techniques: (1) a dopant is gaseously diffused into the amorphous coating at an elevated temperature of about 1000° C.; (2) a dopant is ion-implanted into the amorphous coating, and then the coating is heated to about 900° C, this latter technique being preferable because of the lower crystallizing temperature employed.

What results from the practice of the invention is an extremely, and uniformly, thin transparent electrode coating of polysilicon which may be etched, as is known, into appropriate electrodes . . . and which, most importantly, may be repeated from batch to batch.

The invention has been described in detail with particular reference to certain preferred embodiments thereof, but it will be understood that variations and modifications can be effected within the spirit and scope of the invention.

What is claimed is:

1. The process for forming polysilicon of a uniform thickness on a silicon semiconductor device comprising the steps of:
    (a) heating monocrystalline silicon in a vacuum to form a vapor of silicon;
    (b) exposing the silicon semiconductor device to the silicon vapor, thereby depositing amorphous silicon on said silicon semiconductor device; and
    (c) heating said device to a temperature sufficient to crystallize said amorphous silicon into polycrystalline silicon.

2. The process of claim 1 including the step of impregnating said vacuum deposited silicon with impurity atoms.

3. The process of claim 2 wherein said silicon is impregnated with impurities by ion implantation into said amorphous silicon, and wherein said amorphous silicon is crystallized by heat at a temperature of about 900° C.

4. The process of claim 1 wherein said device is heated in a gaseous atmosphere containing an impurity dopant.

5. The process of claim 1 including the steps of monitoring the thickness of said amorphous silicon and stopping said deposition when said amorphous silicon reaches a predetermined thickness.

6. In the manufacture of a silicon imaging device of the type having a silicon bulk and a transparent silicon dioxide overlay on the silicon bulk, the improvement comprising:
    (a) placing said device in a vacuum chamber;
    (b) heating monocrystalline silicon in said chamber when said chamber is evacuated to form within said chamber a vapor of silicon which, forms an amorphous deposit on said device;
    (c) monitoring the thickness of the silicon deposition on said device, and terminating the deposition of silicon when the deposition reaches a predetermined amount; and
    (d) heating said device to a temperature sufficient to crystallize said deposition into polycrystalline silicon of a uniform thickness.

7. In the improvement to the method of claim 6, the additional improvement of ion implanting impurity atoms into said deposition prior to crystallization of said deposition.

* * * * *